US010808912B2

(12) United States Patent
Chen et al.

(10) Patent No.: US 10,808,912 B2
(45) Date of Patent: Oct. 20, 2020

(54) LIGHT-EMITTING DIODE LIGHTING MODULE

(71) Applicant: HANGZHOU HPWINNER OPTO CORPORATION, Hangzhou (CN)

(72) Inventors: Kai Chen, Hangzhou (CN); Jianming Huang, Hangzhou (CN)

(73) Assignee: HANGZHOU HPWINNER OPTO CORPORATION, Hangzhou (CN)

(*) Notice: Subject to any disclaimer, the term of this patent is extended or adjusted under 35 U.S.C. 154(b) by 0 days.

(21) Appl. No.: 16/307,737

(22) PCT Filed: Jun. 7, 2017

(86) PCT No.: PCT/CN2017/087428
§ 371 (c)(1),
(2) Date: Dec. 6, 2018

(87) PCT Pub. No.: WO2017/211291
PCT Pub. Date: Dec. 14, 2017

(65) Prior Publication Data
US 2019/0128501 A1 May 2, 2019

(30) Foreign Application Priority Data

Jun. 7, 2016 (CN) .................... 2016 2 0553724 U
Aug. 29, 2016 (CN) .................... 2016 2 0980014 U

(51) Int. Cl.
F21V 5/04 (2006.01)
F21V 31/00 (2006.01)
(Continued)

(52) U.S. Cl.
CPC .............. F21V 5/04 (2013.01); F21V 19/002 (2013.01); F21V 31/00 (2013.01); G02B 7/02 (2013.01); H01L 33/52 (2013.01); H05K 1/0274 (2013.01)

(58) Field of Classification Search
None
See application file for complete search history.

(56) References Cited

U.S. PATENT DOCUMENTS

2010/0302777 A1* 12/2010 Knoll ...................... F21V 17/06
362/235
2010/0328945 A1* 12/2010 Song ...................... F21V 15/013
362/240

(Continued)

FOREIGN PATENT DOCUMENTS

| CN | 101078470 A | 11/2007 |
| CN | 101078507 A | 11/2007 |

(Continued)

OTHER PUBLICATIONS

Office Action for Japanese Patent Application No. 2018-0563895 dated Feb. 25, 2020.

(Continued)

Primary Examiner — Elmito Breval
(74) Attorney, Agent, or Firm — Plumsea Law Group, LLC

(57) ABSTRACT

A light-emitting diode lighting module, including: a base, provided with a mounting surface; at least one light-emitting diode element, on the mounting surface of the base, each of the at least one light-emitting diode element including a plurality of light-emitting diode dies packaged together; and a lens assembly, disposed on a side of the base provided with the at least one light-emitting diode element, and forming an accommodating space with the base, wherein the at least one light-emitting diode element is located in the accommodating space, and the lens assembly includes a lens supporting portion and at least one lens portion in one-to-one correspondence with the at least one light-emitting diode element, each of the at least one lens portion is disposed on a corresponding light-emitting diode element to achieve light (Continued)

distribution of the corresponding light-emitting diode element, and the lens supporting portion is connected with the at least one lens portion to support the at least one lens portion.

15 Claims, 8 Drawing Sheets

(51) Int. Cl.
*F21V 19/00* (2006.01)
*G02B 7/02* (2006.01)
*H01L 33/52* (2010.01)
*H05K 1/02* (2006.01)

(56) References Cited

U.S. PATENT DOCUMENTS

| 2011/0299269 | A1 | 12/2011 | Hata et al. | |
|---|---|---|---|---|
| 2012/0187430 | A1* | 7/2012 | West | H01L 25/0753 257/88 |
| 2012/0188766 | A1* | 7/2012 | Lu | F21V 29/2212 362/249.02 |
| 2012/0230033 | A1* | 9/2012 | Yoon | F21K 9/00 362/267 |
| 2013/0194799 | A1* | 8/2013 | Wu | F21V 5/046 362/240 |
| 2015/0260376 | A1* | 9/2015 | Joo | F21V 5/007 362/235 |
| 2017/0114993 | A1* | 4/2017 | Kim | F21V 29/80 |

FOREIGN PATENT DOCUMENTS

| CN | 101187462 A | 5/2008 |
|---|---|---|
| CN | 201237100 Y | 5/2009 |
| CN | 101625074 A | 1/2010 |
| CN | 201887042 U | 6/2011 |
| CN | 205717124 U | 11/2016 |
| CN | 206191286 U | 5/2017 |
| EP | 2733755 A1 | 5/2014 |
| EP | 2863119 A1 | 4/2015 |
| JP | 05087705 H | 4/1993 |
| JP | 2014165142 A | 9/2014 |
| JP | 2015002032 | 1/2015 |
| KR | 1020120062173 A | 6/2012 |
| KR | 20130040088 A | 4/2013 |
| WO | 2013152286 A1 | 10/2013 |
| WO | 2014121049 A1 | 8/2014 |

OTHER PUBLICATIONS

Extended European Search Report, dated Nov. 29, 2019 from EP Application 17809730.9.

* cited by examiner

LIGHT-EMITTING DIODE LIGHTING MODULE

TECHNICAL FIELD

At least one embodiment of the present disclosure relates to a light-emitting diode lighting module.

BACKGROUND

A light-emitting diode (LED) is a semiconductor light emitting device. Generally, the light-emitting diode includes a semiconductor chip. By applying a current to the semiconductor chip, photon emission can be caused by surplus energy released by recombining carriers in the semiconductor, thereby enabling the semiconductor chip to emit light.

A light-emitting diode lighting device is a lighting device using a light-emitting diode as a light source. The light-emitting diode lighting device has advantages of energy conservation, long life, good applicability, short response time and environmental protection. Therefore, the light-emitting diode lighting device has a good application prospect in the fields such as lighting, signal indication, backlight display and the like.

SUMMARY

An embodiment of the present disclosure provides a light-emitting diode lighting module, including: a base, provided with a mounting surface; at least one light-emitting diode element, on the mounting surface of the base, each of the at least one light-emitting diode element including a plurality of light-emitting diode dies packaged together; and a lens assembly, disposed on a side of the base provided with the at least one light-emitting diode element, and forming an accommodating space with the base, wherein the at least one light-emitting diode element is located in the accommodating space, and the lens assembly includes a lens supporting portion and at least one lens portion in one-to-one correspondence with the at least one light-emitting diode element, each of the at least one lens portion is on a corresponding light-emitting diode element to achieve light distribution of the corresponding light-emitting diode element, and the lens supporting portion is connected with the at least one lens portion to support the at least one lens portion.

In some examples, each of the at least one light-emitting diode element is a separately packaged multi-die light-emitting diode package.

In some examples, each of the at least one light-emitting diode element further includes: a bracket, the plurality of light-emitting diode dies being arranged in a matrix on the bracket; and an encapsulation layer, wrapping the bracket and the plurality of light-emitting diode dies.

In some examples, the encapsulation layer directly covers the bracket and the plurality of light-emitting diode dies to seal the plurality of light-emitting diode dies on the bracket.

In some examples, the light-emitting diode lighting module further includes: a circuit board, on the mounting surface, wherein the at least one light-emitting diode element is disposed on the circuit board.

In some examples, the base includes a circuit board.

In some examples, the base includes a main portion supporting the at least one light-emitting diode element.

In some examples, the base further includes a heat sink on a side of the main portion opposite to the mounting surface.

In some examples, the base includes a lamp bracket.

In some examples, the light-emitting diode lighting module further includes: a fixing assembly, on an edge of the lens assembly to fix the lens assembly on the base.

In some examples, fixing assembly includes at least one selected from the group consisting of: a fixing element, configured to apply a pressure to the lens assembly toward the base to fix the lens assembly and the base; a sealant, disposed between the lens assembly and the base to fix the lens assembly on the base, and configured to form the accommodating space between the lens assembly and the base, wherein the accommodating space is a sealed space.

In some examples, the light-emitting diode lighting module further includes an elastic gasket, disposed between the base and the lens assembly, the fixing assembly fixes the lens assembly and the base, so that the elastic gasket is in a compressed state.

In some examples, the lens supporting portion and the fixing element are integrated.

In some examples, the lens supporting portion and the fixing element are separated.

In some examples, the fixing element includes a first portion on a side of lens assembly opposite to the base and facing a portion of the lens assembly, and a second portion extending from the first portion and connecting with the base, the first portion of the fixing element applies a pressure to the lens assembly toward the base.

In some examples, the second portion extends from a lateral surface of the lens assembly to a lateral surface of the base, the second portion of the fixing element and the base cooperate with each other to form a buckle structure, so that the second portion is connected to the base.

In some examples, the second portion extends from a lateral surface of the lens assembly to a lateral surface of the base, the second portion of the fixing element is connected to the base through a fastener.

In some examples, the fixing element includes a first portion on a side of lens assembly opposite to the base and facing a portion of the lens assembly, the light-emitting diode lighting module further includes a fastener, the fastener fixes the first portion to the base.

In some examples, the fastener is a screw.

In some examples, the lamp bracket includes a power mounting portion and a light mounting portion, the lens assembly and the at least one light-emitting diode element are disposed on the light mounting portion, and the power mounting portion is configured to place a power assembly.

In some examples, the base includes a plurality of through holes, the plurality of through holes are located between the light mounting portion and the power mounting portion.

In some examples, the light-emitting diode lighting module further includes a wire lead-out structure, including a wire drawn from the accommodating space through a through hole penetrating the base to an outside of the light-emitting diode lighting device, a gap between the wire and the through hole is sealed.

In some examples, the wire lead-out structure further includes a sealing ring, the sealing ring seals a gap between the wire and the through hole.

In some examples, the wire lead-out structure further includes an externally threaded tube, the wire passes through the sealing ring and the externally threaded tube, an inner circumferential surface of the sealing ring is in close contact with the wire, an outer circumferential surface of the sealing ring is in close contact with an inner circumferential surface of the externally threaded tube, and the externally threaded tube at least partially extends into the though hole and is combined with an inner wall of the through hole.

In some examples, the though hole penetrating the base includes a first hole, a transition conical hole and a second hole which are sequentially connected, the first hole is formed on a side of the base away from the accommodating space, the second hole is formed on a side of the base close to the accommodating space, the transition conical hole is formed between the first hole and the second hole; a diameter of the first hole is greater than a diameter of the second hole, in a direction from an end of the transition conical hole away from the accommodating space to an end of the transition conical hole close to the accommodating space, a diameter of the transition conical hole is gradually changed from the diameter of the first hole to the diameter of the second hole.

In some examples, the first hole of the through hole has an internal thread, the externally threaded tube extends in the first hole of the through hole, and an external thread of the externally threaded tube and the internal thread of the first hole are engaged with each other.

In some examples, the sealing ring includes a head portion having a larger outer diameter and a body portion having a smaller outer diameter, the inner circumferential surface of the externally threaded tube closely is in close contact with an outer circumferential surface of the body portion of the sealing ring.

In some examples, the head portion of the sealing ring is closer to the accommodating space than the body portion of the sealing ring.

In some examples, the outer diameter of the externally threaded tube and the outer diameter the head portion of the sealing ring are greater than the diameter of the second hole of the through hole, the head portion of the sealing ring is pressed between an end of the externally threaded tube and a conical surface of the transition conical hole.

In some examples, the base includes a main portion supporting the at least one light-emitting diode element and a heat sink on a side of the main portion opposite to the mounting surface.

In some examples, the base further includes a mounting portion extending outward from the heat sink at both ends of a light-emitting diode lighting device.

In some examples, the mounting portion is a plate-like structure parallel to the mounting surface or a wedge structure bent into a wedge shape.

In some examples, a waterproof joint is connected to one end of the wire protruding to an outside of the accommodating space.

BRIEF DESCRIPTION OF THE DRAWINGS

In order to clearly illustrate the technical solution of the embodiments of the disclosure, the drawings of the embodiments will be briefly described in the following. It is obvious that the described drawings are only related to some embodiments of the disclosure and thus are not limitative of the disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present invention belongs. The terms "first," "second," etc., which are used in the description and the claims of the present application for invention, are not intended to indicate any sequence, amount or importance, but distinguish various components.

The present disclosure provides a light-emitting diode lighting module, which includes a base provided with a mounting surface; at least one light-emitting diode element on the mounting surface of the base, and a lens assembly disposed on a side of the base provided with the at least one light-emitting diode element. The lens assembly and the base form an accommodating space, the at least one light-emitting diode element is in the accommodating space. Each light-emitting diode element includes a plurality of light-emitting diode dies packaged together. The lens assembly includes a lens supporting portion and at least one lens portion in one-to-one correspondence with the at least one light-emitting diode element, each lens portion is on a corresponding light-emitting diode element to achieve light distribution of the corresponding light-emitting diode element, and the lens supporting portion is connected with the at least one lens portion to support the at least one lens portion. Thus, in the light-emitting diode lighting module provided by the present disclosure, the plurality of light-emitting diode dies disposed in the light-emitting diode element can improve the brightness of the light-emitting diode element and luminous effect. In addition, because the light-emitting diode element includes the plurality of light-emitting diode dies, upon a part of the plurality of light-emitting diode dies breaking down for various reasons, the illumination quality of the light-emitting diode lighting module provided by the present disclosure is less damaged, thereby improving the stability of the illumination and the service life of the light-emitting diode lighting module.

The light-emitting diode lighting modules provided by the embodiments of the present disclosure are described below with reference to the accompanying drawings.

First Embodiment

Figure 1:
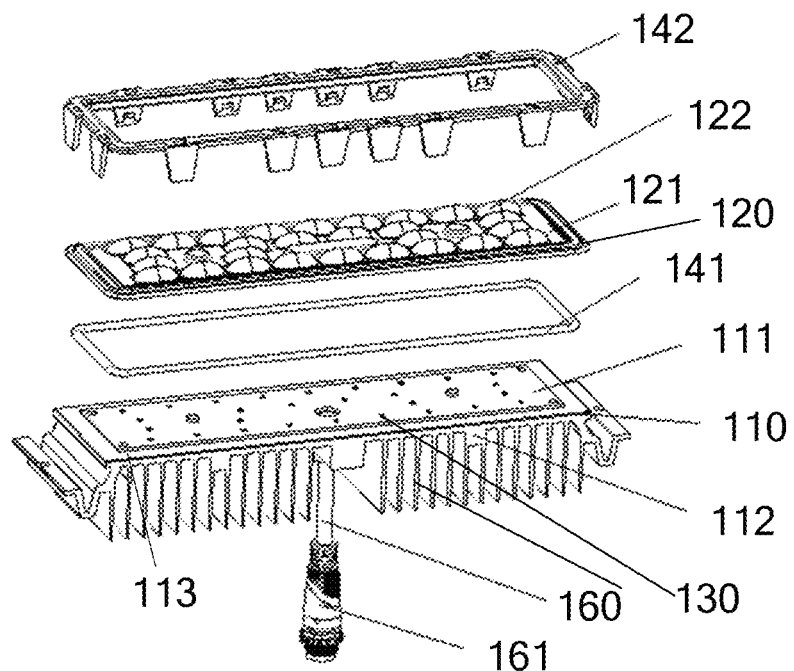
FIG. 1 is a decomposition view of a light-emitting diode lighting module provided by an embodiment of the present disclosure.
Figure 2:
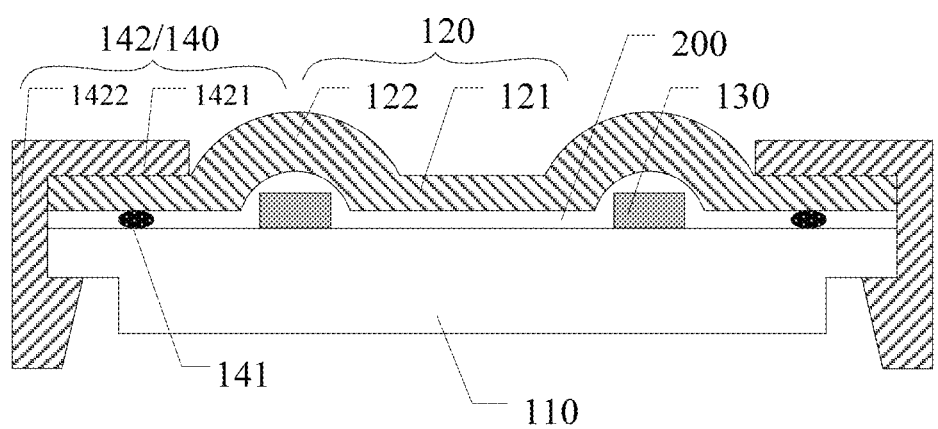
FIG. 2 is a cross section view of a light-emitting diode lighting module provided by an embodiment of the present disclosure.

The present embodiment provides a light-emitting diode lighting module. As illustrated in FIG. 1, the light-emitting diode lighting module includes a base 110, the base 110 having a mounting surface 111; at least one light-emitting diode element 130, on the mounting surface 111 of the base 110, each light-emitting diode element 130 includes a plurality of light-emitting diode dies (which are not illustrated in figures) packaged together; and a lens assembly 120 on a side of the base 110 provided with the at least one light-emitting diode element 130 (that is, a side of the base 110 on which the mounting surface 111 is disposed). As illustrated in FIG. 2, an accommodating space 200 is formed between the lens assembly 120 and the base 110, the at least one light-emitting diode element 130 is in the accommodating space 200, and the lens assembly 120 includes a lens supporting portion 121 and at least one lens portion 122 which is in one-to-one correspondence with the at least one light-emitting diode element 130, each lens portion 122 is located on a corresponding light-emitting diode element 130 to achieve light distribution of the corresponding light-emitting diode element 130, and the lens supporting portion 121 is connected with the at least one lens portion 122 to support the at least one lens portion 122.

In the light-emitting diode lighting module provided by the present embodiment, because one light-emitting diode element can include a plurality of light-emitting diode dies packaged together, the lighting brightness of the light-emitting diode element is higher, so that the lighting effect of the light-emitting diode lighting module provided by the present embodiment can be improved. In the light-emitting diode lighting module provided by the present embodiment, the light-emitting diode elements are in one-to-one correspondence with the lens portions, each light-emitting diode element can achieve light distribution by the lens portion which is in one-to-one correspondence with the light-emitting diode element, that is, point light sources of each light-emitting diode element can be extended into a surface light source through a lens portion corresponding to each light-emitting diode element, thereby achieving an effect of increasing the light emitting surface and eliminating glare. Therefore, upon a part of the plurality of light-emitting diode dies in the light-emitting diode element breaking down for various reasons, the light-emitting diode elements are in one-to-one correspondence with the lens portions, the light-emitting diode element only has a reduced brightness and does not form a dark spot, thereby causing less loss to the lighting effect of the entire light-emitting diode lighting module and improving the stability of the light-emitting diode lighting module. In addition, the light-emitting diode element includes a plurality of light-emitting diode dies, the light-emitting diode dies have different service life due to production batches and the like, upon a light-emitting diode die with a short service life in the light-emitting diode element breaking down, a light-emitting diode die with a long service life can still work normally, and the lighting effect is less affected, thereby improving the service life of the light-emitting diode lighting module.

For example, in the light-emitting diode lighting module provided by an example of the present embodiment, as illustrated in FIG. 1, the light-emitting diode lighting module further includes a heat sink 112, the heat sink 112 can be integrally formed with the base 110. For example, the base 110 includes a main portion 113 supporting the light-emitting diode element 130 and the heat sink 112 on a side of the main portion 113 opposite to the mounting surface 111. Certainly, the present disclosure includes but is not limited thereto, the heat sink and the base can be a separate structure assembled together by a fixing element.

For example, in the light-emitting diode lighting module provided by an example of the present embodiment, the heat sink can be a finned heat sink, or a heat conductive metal block or a heat conductive metal plate.

For example, in the light-emitting diode lighting module provided by an example of the present embodiment, the base can also be provided with no heat sink, and the light-emitting diode can be dissipated by using the base made of a material with excellent thermal conductivity.

For example, in the light-emitting diode lighting module provided by an example of the present embodiment, as illustrated in FIG. 1, the light-emitting diode lighting module further includes a wire 160, the base 110 includes a through hole, the wire 160 is connected with the light-emitting diode element 130 on the base 110 through the through hole, the wire 160 is configured to connect a power source and provide power to the light-emitting diode element 130.

For example, in the light-emitting diode lighting module provided by an example of the present embodiment, as illustrated in FIG. 1, the light-emitting diode lighting module further includes a wire waterproof joint 161, the wire waterproof joint 161 is configured to seal the through hole in the base 110 to prevent moisture from entering the inside of the accommodating space from the through hole and contaminating or corroding the light-emitting diode element or a circuit in the accommodating space.

Second Embodiment

Based on the first embodiment, the present embodiment provides a light-emitting diode lighting module, in the light-emitting diode lighting module, each light-emitting diode element is a separately packaged multi-die light-emitting diode package, the number of the light-emitting diode dies in the multi-die light-emitting diode package is greater than or equal to 2.

Figure 4A:
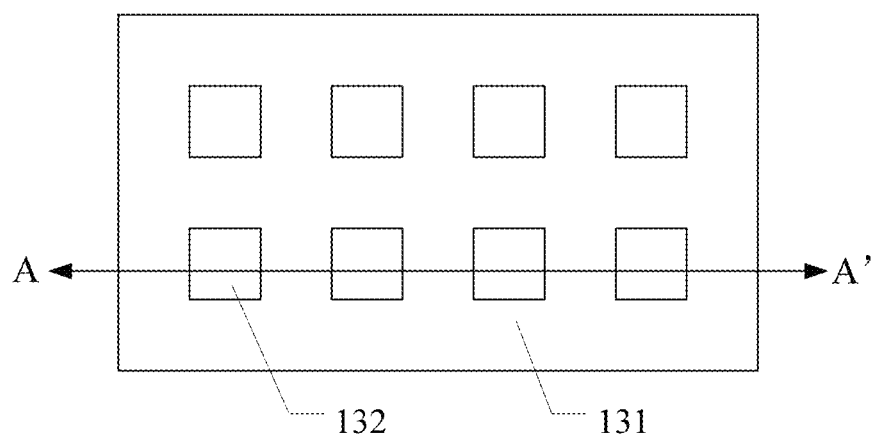
FIG. 4a is a planar view of a light-emitting diode element provided by an embodiment of the present disclosure.

For example, FIG. 4a is a planar view of a light-emitting diode element provided by an embodiment of the present disclosure. As illustrated in FIG. 4a, the light-emitting diode element includes eight light-emitting diode dies 132. In a case that a light-emitting diode die with a short service life cannot emit light, the other seven light-emitting diode dies can still emit light normally. At this time, the brightness of the light-emitting diode element is only reduced to $7/8$. And because the action of the lens portion, the light-emitting diode die that cannot emit light does not form a dark spot. Therefore, the light-emitting diode element can still be used continuously, thereby extending the service life of the light-emitting diode lighting module. It should be noted that, the number of the light-emitting diode dies in the light-emitting diode element is not limited to eight. For example, the number of the light-emitting diode dies in each light-emitting diode element can be two, three, or more than four.

Figure 4B:
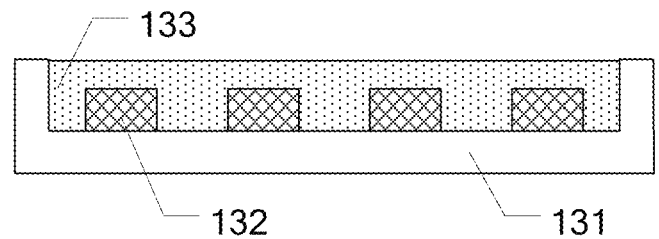
FIG. 4b is a sectional view of a light-emitting diode element in an AA' direction of FIG. 4a provided by an embodiment of the present disclosure.

For example, FIG. 4b is a sectional view of a light-emitting diode element in an AA' direction of FIG. 4a provided by an embodiment of the present disclosure. In the light-emitting diode lighting module provided by an example of the present embodiment, as illustrated in FIGS. 4a to 4b, the light-emitting diode element further includes a bracket 131, the plurality of light-emitting diode dies 132 being arranged in a matrix on the bracket 131; and an encapsulation layer 133 disposed on the bracket 131 and the plurality of light-emitting diode dies 132. The encapsulation layer 133 is configured to encapsulate the plurality of light-emitting diode dies 132 together.

For example, in the light-emitting diode lighting module provided by an example of the present embodiment, as illustrated in FIGS. 4a to 4b, the encapsulation layer 133 wraps the bracket 131 and the plurality of light-emitting diode dies 132 to seal the plurality of light-emitting diode dies 132 on the bracket 131. Therefore, the waterproof and anti-oxidation characteristics, and the service life of the light-emitting diode element can be improved, thereby improving the service life of the light-emitting diode lighting module. It should be noted that, the bracket 131 can include convex portions located around the light-emitting diode to better seal the plurality of light-emitting diode dies 132 with the encapsulation layer 133.

Third Embodiment

Based on the first embodiment, the present embodiment provides a light-emitting diode lighting module. As illustrated in FIG. 2, the lens portion 122 and the lens supporting portion 121 are an integrated structure. Therefore, by integrally forming the lens portion 122 and the lens supporting portion 121, the structure of the lens assembly can be simplified, and the mounting portion is facilitated. Certainly, the present disclosure includes but is not limited thereto, and the lens portion and the lens supporting portion may also be separate structures.

For example, a stiffener can be disposed on the lens assembly 120, or the lens assembly 120 can be partially thickened to prevent deformation of the lens assembly 120.

For example, a material of the lens assembly 120 can be such as PC (polycarbonate) or PMMA (polymethyl methacrylate, also known as acrylic).

For example, in the light-emitting diode lighting module provided by an example of the present embodiment, as illustrated in FIG. 2, the light-emitting diode lighting module further includes a fixing assembly 140 on an edge of the lens assembly 120. The fixing assembly 140 can fix the lens assembly 120 on the base 110. Thus, the lens assembly 120 is fixed to the light-emitting diode element 130 by the fixing assembly 140, and does not easily displace, and the stability of the light distribution of the light-emitting diode element 130 by the lens portion 122 can be improved, thereby improving stability of lighting effects of the light-emitting diode lighting module provided by the present embodiment.

For example, in the light-emitting diode lighting module provided by an example of the present embodiment, as illustrated in FIG. 2, the fixing assembly 140 includes a fixing element 142, configured to apply a pressure to the lens assembly 120 toward the base 110 to fix the lens assembly 120 and the base 110.

For example, as illustrated in FIG. 2, the light-emitting diode lighting module provided by an example of the present embodiment further includes an elastic gasket 141 disposed between the base 110 and the lens assembly 120, that is, disposed between the mounting surface and the lens assembly. The fixing element 142 fixes the lens assembly 120 and the base 110, and compresses the elastic gasket 141 to make the elastic gasket be in close contact with surfaces of the lens assembly 120 and the base 110 by applying a pressure to the lens assembly 120 toward the base 110. Thus, through the action of the elastic gasket 141 and the fixing element 142, on the one hand, the lens assembly 120 can be firmly fixed on the base 110, and on the other hand, the accommodating space 200 formed between the lens assembly 120 and the base 110 can be sealed to achieve a goal of waterproofing.

For example, the elastic gasket 141 is, for example, a closed ring shape, and its cross section is, for example, a circular shape, a T-shape, or a 7-shape etc. The material of the elastic gasket 141 is, for example, silicone rubber, rubber or other elastic materials.

For example, the elastic gasket 141 has an interference fit with the lens assembly 120 and the base 110, interference fit causes the elastic gasket 141 to be deformed and compressed between the lens assembly 120 and the base 110. That is, a distance between a surface of the lens assembly 120 in contact with the elastic gasket 141 and a surface of the base 110 in contact with the elastic gasket 141 is smaller than an original size of the elastic gasket 141 upon the elastic gasket 141 being not compressed in a direction perpendicular to the accommodating surface 111 of the base 110. The elastic gasket 141 is tightly compressed between the lens assembly 120 and the base 110, elastically deformed, and in close contact with the surfaces of the lens assembly 120 and the base 110. Through the interference fit, it is advantageous to seal the accommodating space.

For example, as illustrated in FIG. 2, the fixing element 142 includes a first portion 1421 on a side of lens assembly 120 opposite to the base 110 and facing a portion of the lens assembly 120, and a second portion 1422 extending from the first portion 1421 and connecting with the base 110, the first portion 1421 of the fixing element 142 applies a pressure to the lens assembly 120 toward the base 110.

For example, as illustrated in FIG. 2, the second portion 1422 extends from a lateral surface of the lens assembly 120 to a lateral surface of the base 110, the second portion 1422 of the fixing element 142 and the base 110 cooperate with each other to form a buckle structure, so that the second portion 1422 is connected to the base 110. That is, the fixing element 142 clamps the lens assembly 120 and the base 110 through the first portion 1421 and the second portion 1422, and the first portion 1421 applies a pressure to the lens assembly 120 toward the base 110, thereby fastening the lens assembly 120 and the base 110, and compressing the elastic gasket 141 so that the elastic gasket 141 is in close contact with the surfaces of the lens assembly 120 and the base 110. It should be noted that, the abovementioned fixing element 142 and the lens assembly 120 are different structures which are separated. Because a material of the lens assembly 120 needs to consider the light transmittance, mechanical properties and outdoor performance of the material, the fixing element 142 usually deforms and needs good hardness, strength and elastic properties, the lens assembly 120 and the fixing element 142 can be made of different materials.

However, the present disclosure includes but is not limited thereto, the fixing element 142 can also be integrally formed with the lens assembly 120. For example, the first portion 1421 of the fixing element 142 can be integrally formed with the lens assembly 120 and at the same horizontal plane, and the fixing element 142 is engaged with the base by the second portion 1421 and applies a pressure on the lens assembly 120 toward the base 110.

Figure 3:
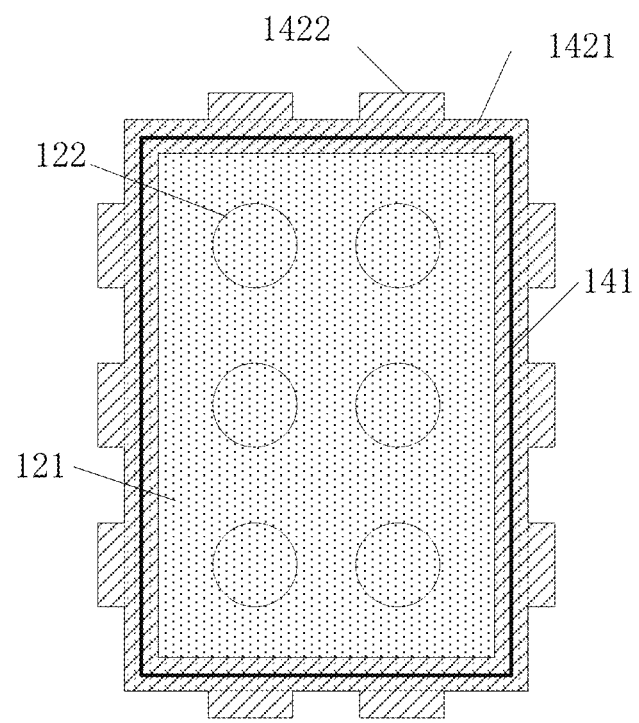
FIG. 3 is a planar view of a light-emitting diode lighting module provided by an embodiment of the present disclosure.

For example, as illustrated in FIG. 3, in a plane parallel to the base, the first portion 1421 of the fixing element 142 can be an annular structure disposed along the edge of the lens assembly 120, thereby making the force of the lens assembly 120 relatively uniform and ensuring a good tightness of the accommodating space. In this case, the elastic gasket 141 can also be an annular structure. As illustrated in FIG. 3, the second portion 1422 of the fixing element 142 can be a plurality of separate sub extending portions. The plurality of sub extending portions are uniformly distributed on a periphery of the lens assembly 120. Certainly, the second portion 1422 of the fixing element 142 can also be an annular structure disposed along the edge of the base 110.

Figure 5:
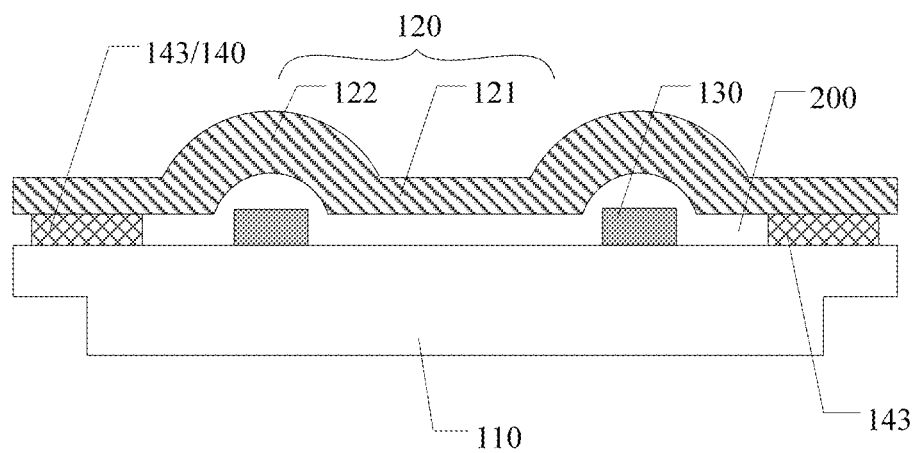
FIG. 5 is a cross section view of a light-emitting diode lighting module provided by an embodiment of the present disclosure.

For example, in the light-emitting diode lighting module provided by an example of the present embodiment, as illustrated in FIG. 5, the fixing assembly 140 can include a sealant 143 disposed between the lens assembly 120 and the base 110, the sealant 143 fixes the lens assembly 120 on the base 110 by a cohesive power, and makes the lens assembly 120 and the base form the accommodating space 200. The accommodating space 200 is a sealed space. It should be noted that, the sealant 143 can be used alone as the fixing assembly 140, or can be used together with the elastic gasket 141 or the fixing element 142. Upon the sealant being used together with the elastic gasket, during the mounting portion process, the lens assembly is laminated to the base after the sealant is applied, and the applied pressure is removed after the sealant is cured. Certainly, a case where the sealant, the elastic gasket and the fixing element exist simultaneously is an exemplified case.

It should be noted that, in the light-emitting diode lighting module provided by an example of the present embodiment, the fixing assembly can also be fixed by other fixing methods, for example, welding, screwing, or the like. The present disclosure is not limited thereto.

Figure 6:
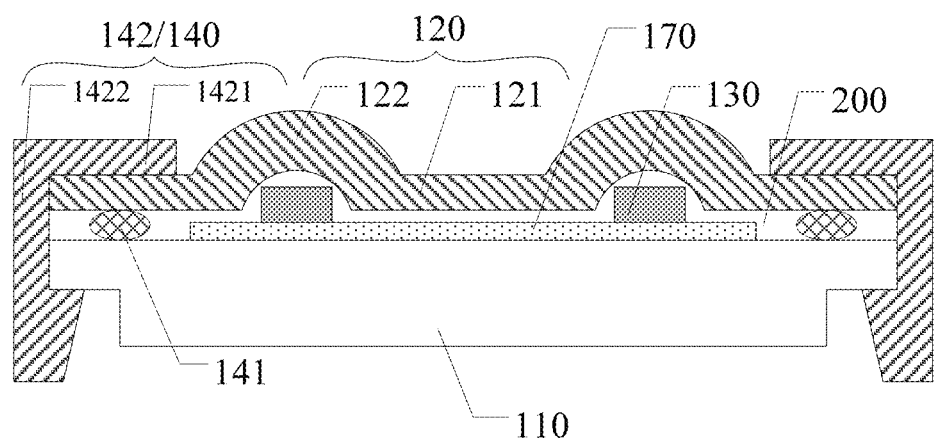
FIG. 6 is a cross section view of another light-emitting diode lighting module provided by an embodiment of the present disclosure.

For example, in the light-emitting diode lighting module provided by an example of the present embodiment, as illustrated in FIG. 6, the light-emitting diode lighting module further includes a circuit board 170 on the mounting surface 111, the abovementioned at least one light-emitting diode element 130 is disposed on the circuit board 170.

For example, the circuit board 170 can be located in the accommodating space 200, thereby preventing the external water and oxygen from corroding the circuit board.

For example, the circuit board 170 can be a PCB (Printed Circuit Board). The light-emitting diode element 130 can be disposed on the PCB to form a PCBA (Printed Circuit Board Assembly) including the light-emitting diode element, and then the PCBA is disposed on the base 110.

Figure 7:
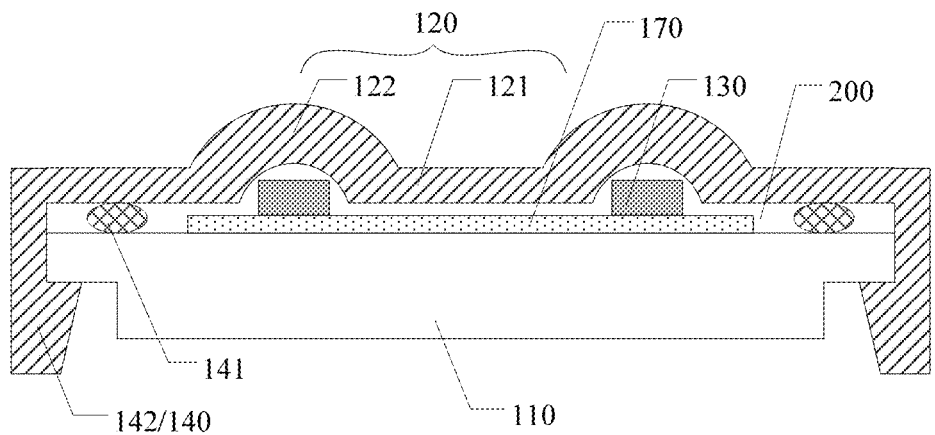
FIG. 7 is a cross section view of another light-emitting diode lighting module provided by an embodiment of the present disclosure.

For example, in the light-emitting diode lighting module provided by an example of the present embodiment, as illustrated in FIG. 7, the lens supporting portion 121 and the fixing element 142 can be an integral structure. Certainly, the present disclosure is not limited thereto, the lens supporting portion and the fixing element can also be separate structures.

Figure 8:
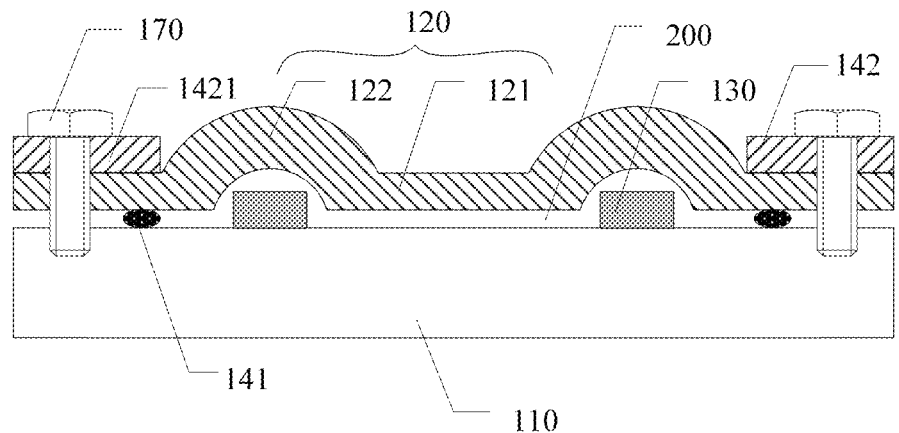
FIG. 8 is a cross section view of another light-emitting diode lighting module provided by an embodiment of the present disclosure.

For example, in the light-emitting diode lighting module provided by an example of the present embodiment, as illustrated in FIG. 8, the lens assembly 120 and the fixing element 142 are separate structures. The fixing element 142 includes a first portion 1421 on a side of lens assembly 120 opposite to the base 110 and facing a portion of the lens assembly 120, the light-emitting diode lighting module further includes a fastener 170, the fastener 170 fixes the first portion 1421 to the base 110. For example, the fastener 170 can be a screw that can be screwed into a through hole with an internal thread in the base to be fixed. Correspondingly, the base 110 includes a threaded hole that matches the fastener 170.

Figure 9:
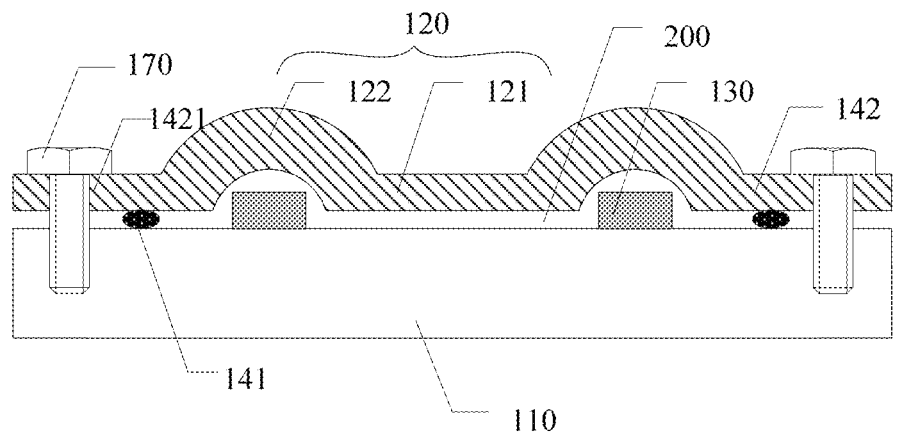
FIG. 9 is a cross section view of another light-emitting diode lighting module provided by an embodiment of the present disclosure.

For example, in the light-emitting diode lighting module provided by an example of the present embodiment, as illustrated in FIG. 9, the lens assembly 120 and the fixing element 142 are integrated. The light-emitting diode lighting module further includes a fastener 170, the fastener 170 fixes the fixing element 142 to the base 110. For example, the fastener 170 can be a screw that can be screwed into a through hole with an internal thread in the base to be fixed. Correspondingly, the base 110 includes a threaded hole that matches the fastener 170.

Figure 10:
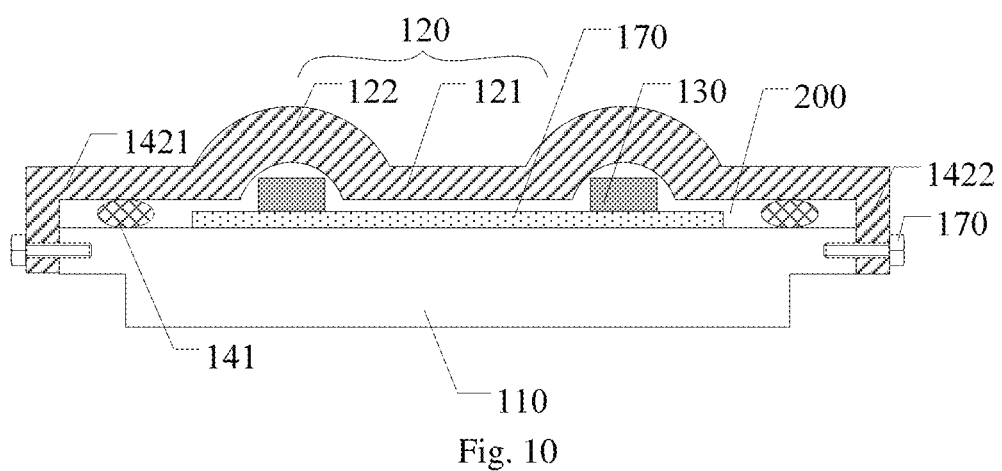
FIG. 10 is a cross section view of another light-emitting diode lighting module provided by an embodiment of the present disclosure.

For example, in the light-emitting diode lighting module provided by an example of the present embodiment, as illustrated in FIG. 10, the second portion 1422 extends from a lateral surface of the lens assembly 120 to a lateral surface of the base 110, the second portion 1422 of the fixing element 142 is connected to the base 110 through a fastener 170.

Fourth Embodiment

The present embodiment provides a light-emitting diode lighting module, as illustrated in FIG. 10, in the light-emitting diode lighting module, the base 110 is a lamp bracket, the lens assembly 120 and the light-emitting diode element 130 are directly fixed on the lamp bracket. It should be noted that, upon the light-emitting diode lighting module including a circuit board, the circuit board is also directly fixed on the lamp bracket.

In the planar view illustrated in FIG. 10, the light-emitting diode lighting module according to an embodiment of the present disclosure is shown as having a substantially rectangular planar structure. However, the planar shape of the light-emitting diode lighting module according to embodiments of the present disclosure is not limited to a rectangle, and may be square, circular, elliptical, or any other regular or irregular shape.

For example, in the light-emitting diode lighting module provided by an example of the present embodiment, as illustrated in FIG. 10, the lamp bracket 110 includes a power mounting portion 1102 and a light mounting portion 1101, the lens assembly 120 and the light-emitting diode element 130 are disposed on the light mounting portion 1101, and the power mounting portion 1102 is configured to place a power assembly.

Figure 11:
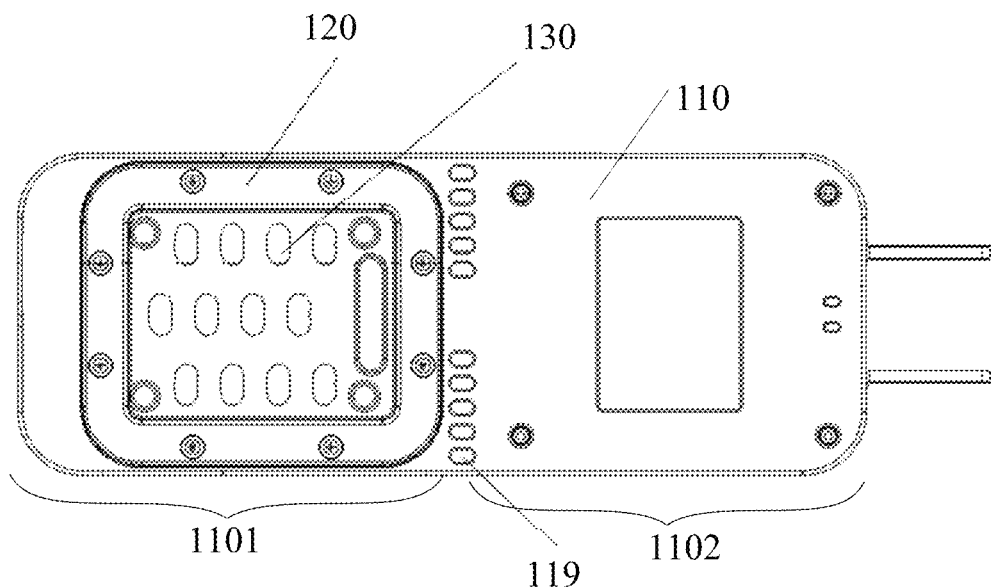
FIG. 11 is a planar view of a lamp bracket provided by an embodiment of the present disclosure.

For example, in the light-emitting diode lighting module provided by an example of the present embodiment, as illustrated in FIG. 11, the lamp bracket 110 includes a plurality of through holes 119, located between the light mounting portion 1101 and the power mounting portion 1102. The plurality of through holes 119 can be used to facilitate timely removal of accumulated water, to prevent the accumulated water from entering the interior of the lamp, and damaging internal components of the lamp, such as a driving power source and a lightning arrester. At the same time, the plurality of through holes 119 can also serve as heat dissipation vents of the light-emitting diode lighting module, so as to further block the mutual transfer and influence of heat between the power assembly and the light-emitting diode element, thereby improving the heat dissipation performance and the stability of the whole lamp.

Fifth Embodiment

The present embodiment provides a light-emitting diode lighting device. For example, the light-emitting diode lighting device can be the light-emitting diode lighting module. The light-emitting diode lighting device provided by the present embodiment can also include a wire drawn from an accommodating space between a lens component (lens assembly) and a base. The wire is drawn from a side of the base, and can be electrically connected with a light-emitting diode element, so that the light-emitting diode element can be provided power source by the wire.

The present embodiment provides a wire lead-out structure. The wire lead-out structure can be applied to the light-emitting diode lighting module provided by any above-mentioned embodiment, but the embodiment of the present is not limited thereto. The wire lead-out structure can be applied to various light-emitting diode lighting modules for sealing the light-emitting diode element in an accommodating space. For example, the light-emitting diode lighting module includes a base provided with a mounting surface; a light-emitting diode element on the mounting surface of the base; a lens assembly on a side of the base provided with the light-emitting diode element; a gasket, disposed between the base and the lens assembly such that the light-emitting diode element is located in a region surrounded by the gasket. The region surrounded by the gasket and located between the lens assembly and the base constitutes a sealed accommodating space, the light-emitting diode element is in the accommodating space. For example, the wire lead-out structure includes a wire drawn from the accommodating space through a through hole penetrating the base to an outside of the light-emitting diode lighting device, a gap between the wire and the through hole is sealed.

Figure 12:
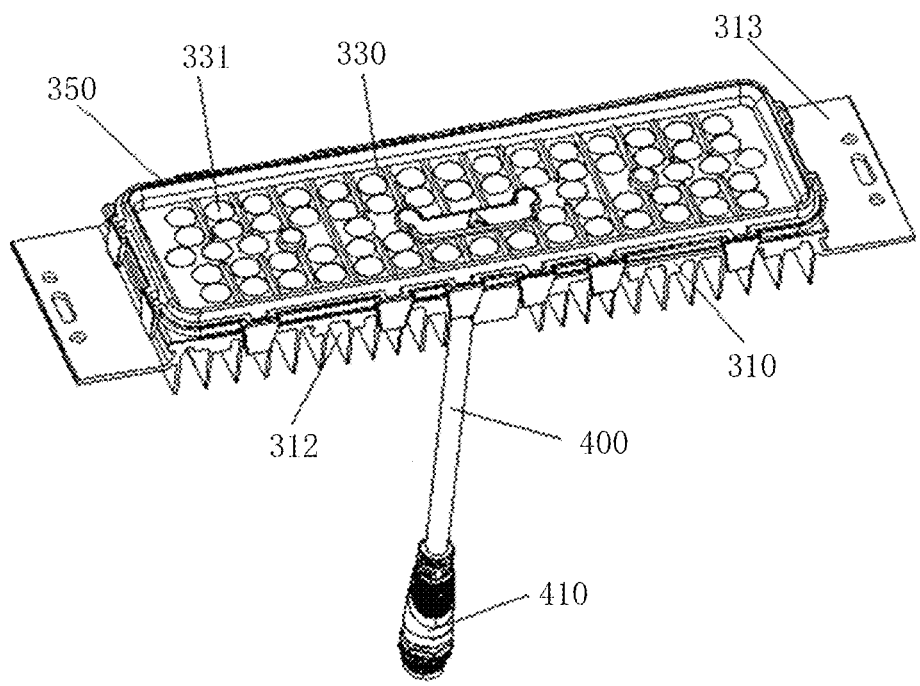
FIG. 12 is a stereo view of a light-emitting diode lighting device in the present disclosure.
Figure 13:
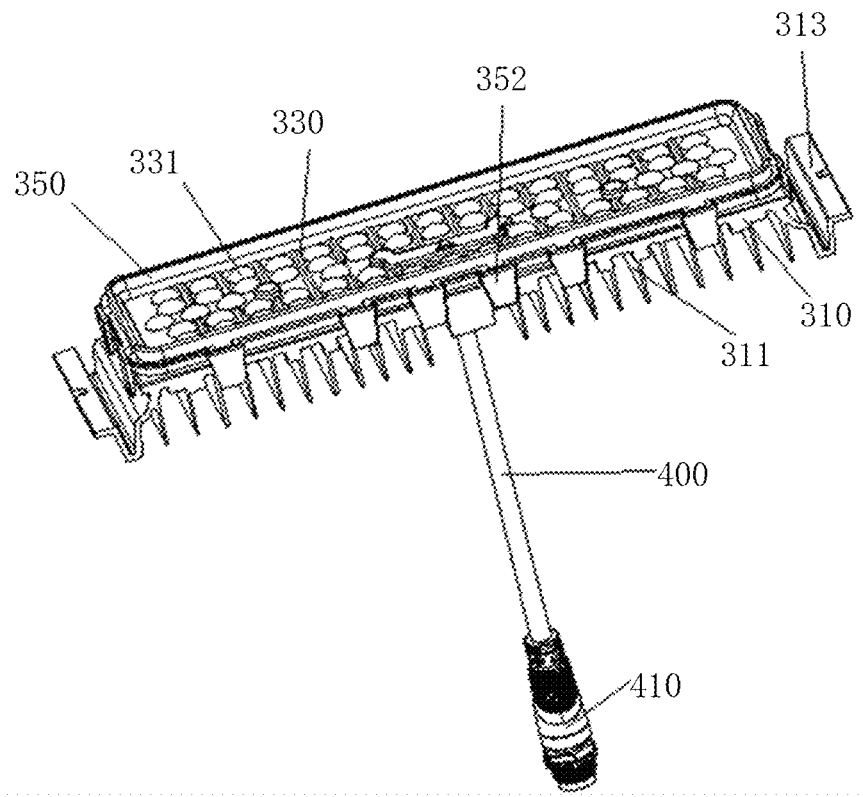
FIG. 13 is a stereo view of a light-emitting diode lighting device in the present disclosure.
Figure 14:
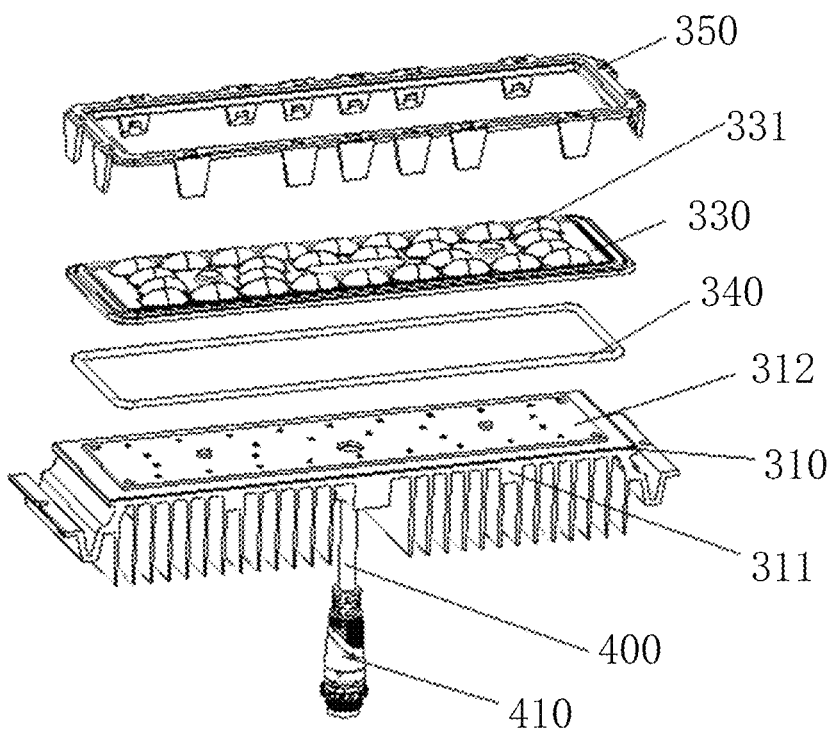
FIG. 14 is a decomposition view of a light-emitting diode lighting device in the present disclosure.

FIGS. 12 and 13 are stereo views of two examples, and FIG. 14 is a decomposition view of a light-emitting diode lighting device in according to an example. For example, as illustrated in FIGS. 12 to 14, in the present embodiment, the light-emitting diode lighting device can includes a base 310, a light-emitting diode element disposed on the base 310, a lens component 330 and a fixing element 350. A positional relationship and an mounting relationship of these components may be referred to the above various embodiments or any other suitable arrangement as long as the light-emitting diode element can be sealed in the accommodating space between the lens component (the lens assembly) and the base. In the present embodiment, for example, the base 310 can include a light source support portion (main portion) for supporting the light source (the light-emitting diode element) and a heat sink 311. The heat sink 311 and the light source support portion may be integrated. The heat sink 311 includes at least one sheet-like or arcus convex portion extending on a side opposite to the mounting surface of the base 310.

In the present embodiment, the heat sink is disposed on an opposite side of the mounting surface of the base, thereby facilitating the dissipation of heat generated during the operation of the light-emitting diode.

In the present embodiment, the base 310 further includes at least one module mounting portion 313 disposed on opposite ends of the base 310 and respectively extending from a sheet-like convex portion or arcus convex portion of the heat sink. As illustrated in FIGS. 12 and 13, the module mounting portion 313 for module mounting portion extending from the heat sink 311 in the present embodiment has two forms, one is a platform mounting portion (FIG. 12), and the other is a wedge mounting portion (FIG. 13). For example, the platform mounting portion is a plate-like structure parallel to the mounting surface of the base 310. For example, the light-emitting diode lighting device according to the present embodiment can be installed on a lamp housing by the module mounting portion disposed on two ends of the heat sink. For example, a notch or hole is provided at an edge portion of the platform mounting portion, and the lighting device can be fixed to the lamp housing through the notch or the hole by using a fastener. Certainly, in other embodiments, the notch in the platform mounting portion can also have other shapes. For example, as illustrated in FIG. 13, a wedge-shaped mounting portion is a wedge-shaped structure formed by bending a plate-shaped member into a wedge shape. Similarly, a notch or hole for fixing can also be disposed on an edge portion of the wedge-shaped mounting portion.

For example, as illustrated in a decomposition view of FIG. 14, the light-emitting diode lighting device according to the present embodiment can also be disposed on the PCB 312. In a direction perpendicular to the mounting surface of the base, the fixing element 350, the lens component 330, the gasket 340, the PCB 312 and the base 310 are sequentially stacked. The mounting order and relative positional relationship of the various components can refer the foregoing various embodiments or any other suitable arrangement, as long as the light-emitting diode element can be sealed in the accommodating space between the lens component (lens assembly) and the base, which is not repeated herein.

For the present embodiment, referring the foregoing various embodiments, it can be known that a region surrounded by the gasket 340 and located between the lens component 330 and the base 310 constitutes a sealed accommodating space, the light-emitting diode element is located in the accommodating space. However, in order to supply power and other control signals to the light-emitting diode in the sealed accommodating space, it is necessary to lead a wire from the sealed space, but the wire lead-out structure must also be sealed to avoid damaging tightness of the accommodating space.

For example, the light-emitting diode lighting device according to the present embodiment includes a wire lead-out structure, including a wire drawn from the accommodating space through a through hole penetrating the base 310 to an outside of the light-emitting diode lighting device. A gap between the wire and the through hole is sealed.

In the present embodiment, by providing the sealed wire lead-out structure, it is possible to supply power to the light-emitting diode in the sealed accommodating space while ensuring the tightness of the accommodating space, so as to prevent moisture and the like from entering the accommodating space and adversely affecting the light-emitting diode.

For sealing the wire lead-out structure, for example, the gap between the wire and the through hole penetrated by the wire can be sealed, or other manners can be adopted. For example, the gap between the wire and the through hole can be sealed by a sealing ring, a specific form for sealing by adopting sealing ring is not particularly limited. A material of the sealing ring can be an elastic material, for example, the sealing ring is made of a rubber material.

Some schematic structures according to the present embodiment are described below with reference to the FIGS. 15a and 15b.

For example, the wire lead-out structure further includes a sealing ring and an externally threaded tube other than the wire. The wire can pass through the sealing ring and the externally threaded tube. An inner circumferential surface of the sealing ring is in close contact with the wire, an outer circumferential surface of the sealing ring is in close contact with an inner circumferential surface of the externally threaded tube, and the externally threaded tube at least partially extends into the though hole and is combined with an inner wall of the through hole. That is, the sealing ring is sleeved on the wire, the externally threaded tube is sleeved on the sealing ring, and the externally threaded tube is combined with the through hole in the base.

Figure 15A:
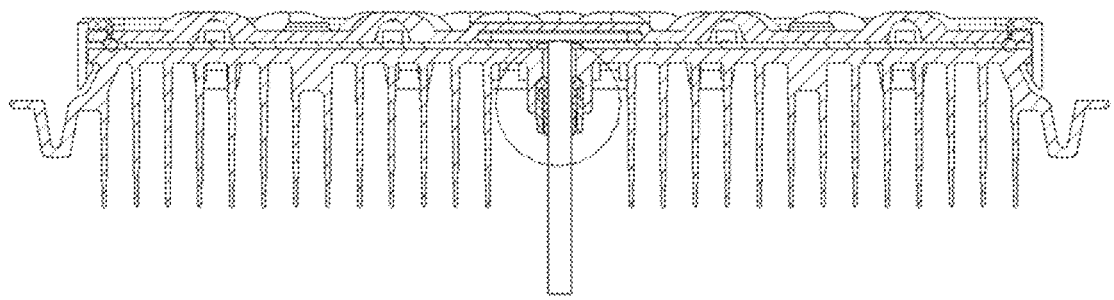
FIG. 15a and FIG. 15b are respectively a cross section view and a partial enlargement view of a light-emitting diode lighting device.
Figure 15B:
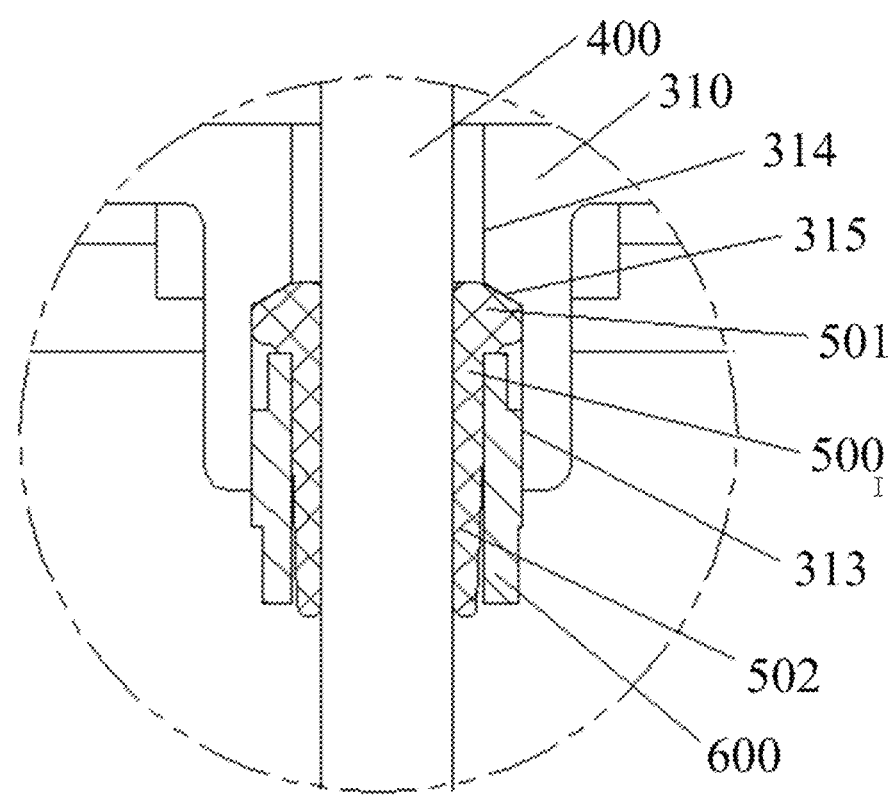

FIG. 15a and FIG. 15b are respectively a cross section view and a partial enlargement view of a light-emitting diode lighting device according the present embodiment. For example, FIG. 15a is a cross section view of a module mounting portion passing through the light-emitting diode lighting device and a wire lead-out structure, and FIG. 15b is an enlarged view of a portion indicated by a circle in FIG. 15a.

Referring to FIGS. 15a and 15b, a wire electrically connected with the assembled PCB (that is, electrically connected to the light-emitting diode element) passes through the through hole of one side of the base 310 with respect to the light-emitting diode element, and is electrically connected to a power source assembly. For example, the wire herein can be directly connected with the light-emitting diode element, and can also be directly connected with the PCB, the present disclosure is not specifically limited thereto.

For example, the though hole penetrating the base includes a first hole 313, a transition conical hole 315 and a second hole 314 which are sequentially connected. The first hole 313 is formed on a side of the base away from the accommodating space, the second hole 314 is formed on a side of the base close to the accommodating space, the transition conical hole 315 is formed between the first hole 313 and the second hole 314. A diameter of the first hole 313 is greater than a diameter of the second hole 314, in a direction from an end of the transition conical hole 315 away from the accommodating space to an end of the transition conical hole 315 close to the accommodating space, a diameter of the transition conical hole 315 is gradually changed from the diameter of the first hole 313 to the diameter of the second hole 314.

For example, the sealing ring 500 is a T-shaped sealing ring, that is, the cross-sectional shape of the sealing ring in an axial direction is substantially T-shaped, and has a hole portion in the axial direction of the T-shape. For example, the T-shaped sealing ring includes a head portion 501 having a larger outer diameter and a body portion 502 having a smaller outer diameter. The diameter of the holes of each portion of the T-shaped sealing ring in the axial direction is approximately equal. That is, a hole of the sealing ring can be a cylinder, the diameter matches with the wire. Certainly, the present disclosure is not specially shown. For example, an original diameter of the hole of the sealing ring is smaller than the diameter of the wire. Upon the sealing ring being sleeved on the wire, it can be closely attached to the wire to form a sealing structure between the two interfaces. The body portion 502 of the T-shaped sealing ring may have the same outer diameter from a direction close to its head portion 501 to a distance away from the head portion 501, or may have a gradually decreasing outer diameter.

The externally threaded tube is sleeved on the body portion 502 of the T-shaped sealing ring. For example, the inner diameter of the externally threaded tube 600 is disposed such that upon externally threaded tube 600 being mounted on the T-shaped sealing ring 500 that is sleeved on the wire 400, the externally threaded tube 600 can press the T-shaped sealing ring to form a sealing environment. The externally threaded tube 600 can match with the first hole 313 such that the externally threaded tube 600 can be combined with the first hole 313. For example, an inner wall of the first hole 313 is provided with a thread structure matching an external thread of the externally threaded tube 600, the external thread of the externally threaded tube and the internal thread of the first hole are meshed with each other.

For example, the outer diameter of the head portion 501 of the T-shaped sealing ring 500 is equal to or greater than the inner diameter of the first hole 313, and the outer diameter of the externally threaded tube 600 is greater than the diameter (inner diameter) of the second hole 314. In this case, in an extending direction of the wire, the end surface of the externally threaded tube 600 is at least partially opposite to a conical surface of the transition conical hole 315. Upon the externally threaded tube 600 protruding to the first hole 313, the head portion 501 of the T-shaped threaded tube 500 can be pressed against the conical surface of the transition conical hole to further enhance the sealing effect. That is, the head portion of the sealing ring is pressed between an end of the externally threaded tube and the conical surface of the transition conical hole.

For example, the body portion of the T-shaped sealing ring 500 has a uniform outer diameter in the axial direction, or the outer diameter of the body portion 502 is gradually reduced in a direction away from the head portion 501 to form a conical portion.

For example, an inner circumferential surface of the T-shaped sealing ring is in close contact with the wire. Upon the externally threaded tube moving toward the head portion of the sealing ring with respect to the T-shaped sealing ring, the inner circumferential surface of the externally threaded tube fits closer to the T-shaped sealing ring, so that the sealing effect between the sealing ring and the wire is better. The external thread of the externally threaded tube cooperates with the internal thread of the first hole, and the head portion of the T-shaped sealing ring is respectively matched with the one end surface of the externally threaded tube and the conical surface of the transition conical hole. Upon the externally threaded tube being close to the first hole, the head portion of the T-shaped sealing ring fits tightly with the conical surface of the transition conical hole under the compression of the externally threaded tube, so that the sealing effect between the second hole and the T-type sealing ring is getting better and better.

In addition, it should be noted that, although the lighting device described above according to the present embodiment is based on the first embodiment to the third embodiment (the above-described convex portion or first groove is provided on the inner side of the gasket or directly above the gasket). The structure of the present embodiment is not limited to the basic structure described in the first embodiment to the third embodiment, and may be applied to the case in which the above-described convex portion or first groove is provided outside the gasket, which is not detailed described herein. In some examples, the above-mentioned convex portion or first groove is provided on the outer side of the gasket, and because the first portion of the fixing element has a gap between the portion other than the convex portion and the lens component, in these examples, a resultant force of the fixing element to the gasket is on the outside of the gasket. In the examples, a problem of the central convexity of the lens component can be solved by other means.

Furthermore, as illustrated in FIGS. 12 to 14, for the wire 400, a waterproof joint is connected to one end of the wire protruding to an outside of the accommodating space. The specific structure of the waterproof joint is not particularly limited in the present embodiment, and any suitable waterproof joint can be used.

In the present disclosure, the same or similar components in the various embodiments use the same or similar reference numerals, and the description of these components can refer to various embodiments, and the structures and solutions of different embodiments can be combined or partially combined with each other.

The foregoing is only the embodiments of the present disclosure and not intended to limit the scope of protection of the present disclosure; the protection scope of the present disclosure should be based on the protection scope of the claims.

The present application claims priority of China Patent application No. 201620553724.3 filed on Jun. 7, 2016 and China Patent application No. 201620980014.9 filed on Aug. 29, 2016, the content of which is incorporated in its entirety as portion of the present application by reference herein.

What is claimed is:

1. A light-emitting diode lighting module, comprising:
   a base, provided with a mounting surface;
   at least one light-emitting diode element, disposed on the mounting surface of the base, each of the at least one light-emitting diode element comprising a plurality of light-emitting diode dies packaged together;
   a lens assembly, disposed on a side of the base provided with the at least one light-emitting diode element, and forming an accommodating space with the base, wherein the at least one light-emitting diode element is located in the accommodating space, and the lens assembly comprises a lens supporting portion and at least one lens portion in one-to-one correspondence with the at least one light-emitting diode element, each of the at least one lens portion is disposed on a corresponding light-emitting diode element to achieve light distribution of the corresponding light-emitting diode element, and the lens supporting portion is connected with the at least one lens portion to support the at least one lens portion; and
   a wire lead-out structure, comprising a wire drawn from the accommodating space through a through hole penetrating the base to an outside of the light-emitting diode lighting module, wherein a gap between the wire and the through hole is sealed;
   wherein the wire lead-out structure further comprises a sealing ring, the sealing ring seals the gap between the wire and the through hole
   wherein the wire lead-out structure further comprises an externally threaded tube, the wire passes through the sealing ring and the externally threaded tube, an inner circumferential surface of the sealing ring is in close contact with the wire, an outer circumferential surface of the sealing ring is in close contact with an inner circumferential surface of the externally threaded tube, and the externally threaded tube at least partially extends into the though hole and is combined with an inner wall of the through hole;
   wherein the though hole penetrating the base comprises a first hole, a transition conical hole and a second hole which are sequentially connected, the first hole is formed on a side of the base away from the accommodating space, the second hole is formed on a side of the base close to the accommodating space, the transition conical hole is formed between the first hole and the second hole; a diameter of the first hole is greater than a diameter of the second hole, in a direction from an end of the transition conical hole away from the accommodating space to an end of the transition conical hole close to the accommodating space, a diameter of the transition conical hole is gradually changed from the diameter of the first hole to the diameter of the second hole;
   wherein the first hole of the through hole has an internal thread, the externally threaded tube extends in the first hole of the through hole, and an external thread of the externally threaded tube and the internal thread of the first hole are engaged with each other;
   wherein at least a part of the sealing ring is located between the inner circumferential surface of the externally threaded tube and the wire, and at least another part of the sealing ring is located between an end of the externally threaded tube close to the accommodating space and an inner wall of the transition conical hole; and
   wherein the sealing ring has a substantially equal inner diameter at different portions in the axial direction.

2. The light-emitting diode lighting module according to claim 1, wherein each of the at least one light-emitting diode element is a separately packaged multi-die light-emitting diode package.

3. The light-emitting diode lighting module according to claim 1, wherein each of the at least one light-emitting diode element further comprises:
   a bracket, the plurality of light-emitting diode dies being arranged in a matrix on the bracket; and
   an encapsulation layer, wrapping the bracket and the plurality of light-emitting diode dies.

4. The light-emitting diode lighting module according to claim 3, wherein the encapsulation layer directly covers the bracket and the plurality of light-emitting diode dies to seal the plurality of light-emitting diode dies on the bracket.

5. The light-emitting diode lighting module according to claim 1, wherein the base comprises a circuit board.

6. The light-emitting diode lighting module according to claim 1, wherein the base comprises a main portion supporting the at least one light-emitting diode element, and a heat sink on a side of the main portion opposite to the mounting surface.

7. The light-emitting diode lighting module according to claim 1, further comprising:
   a fixing assembly, disposed on an edge of the lens assembly to fix the lens assembly on the base,
   wherein the fixing assembly comprises at least one selected from the group consisting of:
   a fixing element, configured to apply a pressure to the lens assembly toward the base to fix the lens assembly and the base; and
   a sealant, disposed between the lens assembly and the base to fix the lens assembly on the base, and configured to form the accommodating space between the lens assembly and the base, wherein the accommodating space is a sealed space.

8. The light-emitting diode lighting module according to claim 7, further comprising:

an elastic gasket, disposed between the base and the lens assembly, wherein the fixing assembly fixes the lens assembly and the base, so that the elastic gasket is in a compressed state.

9. The light-emitting diode lighting module according to claim 7, wherein the fixing element comprises a first portion on a side of lens assembly opposite to the base and facing a portion of the lens assembly, and a second portion extending from the first portion and connecting with the base, the first portion of the fixing element applies a pressure to the lens assembly toward the base.

10. The light-emitting diode lighting module according to claim 9, wherein the second portion extends from a lateral surface of the lens assembly to a lateral surface of the base, the second portion of the fixing element and the base cooperate with each other to form a buckle structure, so that the second portion is connected to the base.

11. The light-emitting diode lighting module according to claim 9, wherein the second portion extends from a lateral surface of the lens assembly to a lateral surface of the base, the second portion of the fixing element is connected to the base through a fastener.

12. The light-emitting diode lighting module according to claim 7, wherein the fixing element comprises a first portion on a side of lens assembly opposite to the base and facing a portion of the lens assembly, the light-emitting diode lighting module further comprises a fastener, the fastener fixes the first portion to the base.

13. The light-emitting diode lighting module according to claim 1, wherein the base comprises a lamp bracket, the lamp bracket comprises a power mounting portion and a light mounting portion, the lens assembly and the at least one light-emitting diode element are disposed on the light mounting portion, and the power mounting portion is configured to place a power assembly.

14. The light-emitting diode lighting module according to claim 1, wherein the sealing ring comprises a head portion having a larger outer diameter and a body portion having a smaller outer diameter, the inner circumferential surface of the externally threaded tube is in close contact with an outer circumferential surface of the body portion of the sealing ring, the head portion of the sealing ring is closer to the accommodating space than the body portion of the sealing ring.

15. The light-emitting diode lighting module according to claim 14, wherein the outer diameter of the externally threaded tube and the outer diameter the head portion of the sealing ring are greater than the diameter of the second hole of the through hole, the head portion of the sealing ring is pressed between an end of the externally threaded tube and a conical surface of the transition conical hole.

* * * * *